US008679960B2

(12) United States Patent
Papasouliotis et al.

(10) Patent No.: US 8,679,960 B2
(45) Date of Patent: Mar. 25, 2014

(54) TECHNIQUE FOR PROCESSING A SUBSTRATE HAVING A NON-PLANAR SURFACE

(75) Inventors: George D. Papasouliotis, North Andover, MA (US); Vikram Singh, North Andover, MA (US); Heyun Yin, Saugus, MA (US); Helen L. Maynard, North Reading, MA (US); Ludovic Godet, North Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/902,250

(22) Filed: Oct. 12, 2010

(65) Prior Publication Data

US 2011/0086501 A1    Apr. 14, 2011

Related U.S. Application Data

(60) Provisional application No. 61/251,442, filed on Oct. 14, 2009.

(51) Int. Cl.
*H01L 21/425*    (2006.01)
*H01L 21/38*    (2006.01)

(52) U.S. Cl.
USPC .... 438/514; 438/547; 438/549; 257/E21.334; 257/E21.211

(58) Field of Classification Search
USPC .......... 438/514, 527, 547, 549; 257/E21.334
See application file for complete search history.

(56) References Cited

U.S. PATENT DOCUMENTS

| 3,676,317 | A  | * | 7/1972  | Harkins, Jr. ................ 204/192.3 |
| 6,228,750 | B1 | * | 5/2001  | Shibib ........................... 438/558 |
| 2003/0194849 | A1 | * | 10/2003 | Johnson et al. ............... 438/510 |
| 2005/0287307 | A1 |   | 12/2005 | Singh et al. |
| 2006/0240636 | A1 | * | 10/2006 | Ryu et al. ...................... 438/424 |
| 2007/0087574 | A1 | * | 4/2007  | Gupta et al. .................. 438/758 |
| 2008/0242048 | A1 | * | 10/2008 | Nakai et al. .................. 438/440 |
| 2009/0124095 | A1 | * | 5/2009  | Hsu .............................. 438/766 |
| 2010/0273322 | A1 | * | 10/2010 | Papasouliotis et al. ........ 438/527 |

FOREIGN PATENT DOCUMENTS

WO    2004013371 A2    2/2004

OTHER PUBLICATIONS

D. Lenoble, et al., Enhanced performance of PMOS MUGFET via integration of conformal plasma-doped source/drain extensions, 2006 Symposium on VLSI Technology Digest of Technical Papers, 2006, 2 pp, IEEE, Piscataway, NJ, USA.

(Continued)

*Primary Examiner* — George Fourson, III
*Assistant Examiner* — Wilner Jean Baptiste

(57) ABSTRACT

A method of processing a substrate having horizontal and non-horizontal surfaces is disclosed. The substrate is implanted with particles using an ion implanter. During the ion implant, due to the nature of the implant process, a film may be deposited on the surfaces, wherein the thickness of this film is thicker on the horizontal surfaces. The presences of this film may adversely alter the properties of the substrate. To rectify this, a second process step is performed to remove the film deposited on the horizontal surfaces. In some embodiments, an etching process is used to remove this film. In some embodiments, a material modifying step is used to change the composition of the material comprising the film. This material modifying step may be instead of, or in addition to the etching process.

21 Claims, 3 Drawing Sheets

(56) References Cited

OTHER PUBLICATIONS

Donggun Park, et al., Stress-induced leakage current comparison of giga-bit scale DRAM capacitors with OCS (one-cylinder-storage) node, 2000 IEEE International Integrated Reliability Workshop Final Report, 2000, pp. 116-119, IEEE, Piscataway, NJ, USA.

Steve Walther, et al., Plasma implanted ultra shallow junction boron depth profiles: Effect of plasma chemistry and sheath conditions, Journal of Vacuum Science and Technology: Part B, Jan. 27, 2006, pp. 489-493, vol. 24, No. 1, AVS/AIP, Melville, New York, NY, USA.

Kilho Lee, et al., Plasma immersion ion implantation as an alternative deep trench buried-plate doping technology, 2000 International Conference on Ion Implantation Technology Proceedings, 2000, pp. 460-463, Ion Implantation Technology, IEEE, Piscataway, NJ, USA.

\* cited by examiner

TECHNIQUE FOR PROCESSING A SUBSTRATE HAVING A NON-PLANAR SURFACE

This application claims priority of U.S. Provisional Patent Application Ser. No. 61/251,442, filed Oct. 14, 2009, the disclosure of which is incorporated herein by reference in its entirety.

FIELD

The present disclosure relates to a method for processing a substrate having a non-planar surface.

BACKGROUND

In manufacturing electronic devices, it may be necessary to process a substrate having a non-planar surface. Examples of such devices include three dimensional (3D) FinFETs having raised fins with horizontally and vertically oriented surfaces, and CMOS image sensors (CIS) and eDRAMs, each of which have trenches with horizontally and vertically oriented surfaces. One of the techniques used to process such substrates may include doping to modify electrical, mechanical, optical, and thermal properties, or a combination of such properties of the original substrate. The source/drain (SD) regions of FinFETs, sidewall of shallow trenches in CMOS image sensors, and sidewall of deep trenches (DT) in eDRAMs may be doped to modify the properties of the substrates.

As the electronic devices require uniform properties, it may be desirable for the techniques to conformally process surfaces oriented in different angles. In the doping techniques, for example, it may be desirable to achieve an equal or substantially equal dopant concentration in the regions near the differently oriented surfaces. Although numerous techniques have been proposed, the proposed techniques have achieved limited success. For example, the dopant concentration along the horizontally extending surfaces may be much greater than that of the vertically extending surfaces in these proposed techniques. Such a variation in processing may result in substrates with non-uniform properties, and the final devices may not operate optimally. In addition, some of these processes also deposit material on the substrate, whereby more of the deposited material is disposed on the horizontally extending surfaces than on the vertically extending surfaces. Accordingly, a new technique is needed.

SUMMARY

A method of processing a substrate having horizontal and non-horizontal surfaces is disclosed. The substrate is implanted with particles using ion implantation. Following the ion implant or simultaneously with it, due to the nature of the implant process, a film may be deposited on the surfaces, wherein the thickness of this film is thicker on the horizontal surfaces. The presences of this film may adversely alter the properties of the substrate. To rectify this, a second process step is performed to remove the film deposited on the horizontal surfaces. In some embodiments, an etching process is used to remove this film. In some embodiments, a material modifying step is used to change the composition of the material comprising the film. This material modifying step may be instead of, or in addition to, the etching process.

BRIEF DESCRIPTION OF THE DRAWINGS

The invention, in accordance with preferred and exemplary embodiments, together with further advantages thereof, is more particularly described in the following detailed description, taken in conjunction with the accompanying drawings. The drawings are not necessarily to scale, emphasis instead generally being placed upon illustrating principles of the invention.

DETAILED DESCRIPTION

In the present disclosure, several embodiments of a novel technique for processing a substrate with a non-planar surface are introduced. For purpose of clarity, the embodiments are introduced in the context of "particles." The particles may be charged or neutral, sub-atomic, atomic, or molecular particles that process the substrate. The substrate, herein, may be metallic, semiconducting, or insulating substrate, or a combination thereof. The substrate may be non-planar having one or more protrusions or trenches that extend in vertical direction, one or more horizontally extending surfaces, and one or more vertically extending surfaces. In other embodiments, the substrate may be non-planar in that one or more surfaces is not horizontally extending.

For purpose of clarity and simplicity, the technique for processing the non-planar substrate is disclosed in context to a plasma based system such as, for example, a plasma assisted doping (PLAD) or plasma immersion ion implantation (PIII) process system. However, other systems are not precluded in the present disclosure. Example of the other systems may include a beam-line ion implantation system, flood implant system, or ion source with a plasma sheath modifier.

Technique for Processing a Substrate with Non-Planar Surface

Figure 1A:
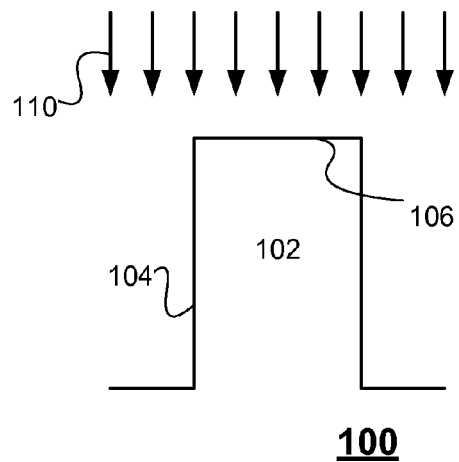
FIGS. 1a-c illustrate a technique for processing a substrate having a non-planar surface according to one embodiment.
Figure 1B:
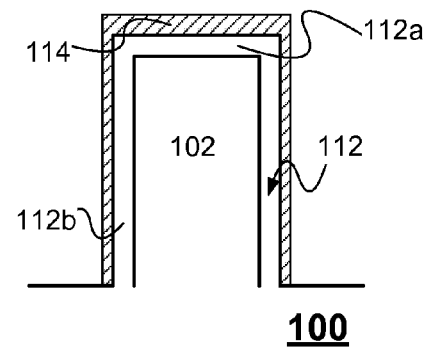
Figure 1C:
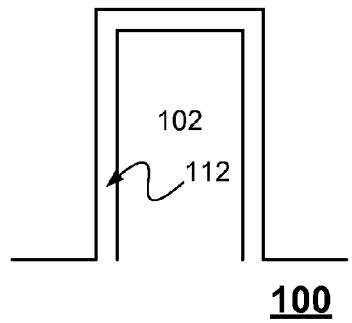

Referring to FIGS. 1a-1c, there is shown a technique for processing a substrate having a non-planar surface according to one embodiment of the present disclosure. In the present embodiment, the substrate 100 may be a substrate having a protrusion that extends in vertical direction, or a non-horizontal direction. For example, the substrate 100 may be a FinFET comprising one or more vertically extending fins 102. As illustrated in FIG. 1a, the protrusion or the fin 102 may comprise vertically extending surfaces 104 ("vertical surface 104"), near the side of the fin 102, and a horizontally extending surface 106 (the "horizontal surface 106"), near the top of the fin 102. Although the phrase "vertical" is used throughout this disclosure, it is understood that the principles described herein are applicable to a substrate having both horizontal surfaces, and non-horizontal surfaces, where the non-horizontal surfaces may or may not be vertical.

To alter one or more properties (e.g. electrical, mechanical, and/or optical) of the fin 102, dopants of different species capable of altering the properties may be introduced. For example, if the substrate is a silicon based substrate, the dopant may contain boron, carbon, gallium, germanium, phosphorous, arsenic, and/or combination thereof. Other types of dopants, however, are not precluded in the present disclosure. In another embodiment, the particles 110 containing the same species as that included in the fin 102 may be introduced. For example, silicon or silicon containing particles may also be introduced to silicon containing fin 102.

In the present embodiments, the dopants 110 may be introduced via ion implantation process such as, for example, PLAD or PIII process. However, other types of ion implantation processes or other types of particle introducing processes are not precluded in the present disclosure. For example, the diffusion process for introducing dopants is not precluded in the present disclosure. In PLAD or PIII process, a feed gas containing the dopant species is introduced near the substrate 100. The feed gas is then excited to form a plasma (not shown) containing the fragments of the feed gas. The fragments may include, among others, electrons, atomic or molecular ions of dopant species and other species, and neutrals and radicals of dopant species and other species. Thereafter, bias may be provided to the substrates to attract ionized dopants from the plasma. In the present embodiment, the dopants 110 may be introduced to the substrate at 0° (i.e. 0° from an imaginary axis that is perpendicular to the substrate 100) or substantially 0°. However, other angles or a range of angles, for example, 7°, 15°, 30°, 45°, 60°, or any other angles ranging from 0-90°, are not precluded.

As illustrated in FIG. 1b, the dopants 110 from the plasma may be implanted into the fin 102 to form an implanted region 112. It is preferable that the vertical implanted regions 112b are implanted with an amount of dopants equal to those in horizontal implanted region 112a. In addition, a film 114 containing the dopants species may be formed on the surface of the fin on the horizontal surface 106 and the vertical surfaces 104.

A film 114 may be formed as reactive neutral or radical fragments from the plasma are disposed near the vertical and horizontal surface 104 and 106, and chemically react. This film may be the result of deposition of particles onto the substrate. Due to the line-of-sight, directional nature of the PLAD or PIII, a greater amount of the fragments may be disposed near the top portion of the fin 102, near the horizontal surface 106. When formed, the film 114 may have greater thickness near the top portion of the fin 102 than near the side portion of the fin 102. As such, the fin 102 contains excess dopants near the top portion.

In the present disclosure, it may be desirable for one or more properties of the fin 102 to be uniform. For example, it may be desirable for the dose of the dopants contained near the top portion and the side portion of the fin 102 to be substantially uniform. To achieve uniform or substantially uniform dopant dose, excess dopants from the top portion of the fin 102 may be selectively removed.

To remove the excess dopants, various types of etching process may be performed. For example, a sputtering process may be performed. In the sputtering process, an inert (noble) gas, hydrogen, or a mixture if inert gasses and hydrogen may be ionized near the substrate 100. The generated ions may then be directed toward the fin 102 with sufficient kinetic energy to sputter the excess dopants, such as by biasing the substrate to attract the ions toward the fin 102. In the present embodiment, it may be desirable to control the incident angle of the particles. There are several ways in which the incident angle of the particles can be controlled. In some embodiments, a plasma sheath modifier is employed. In other embodiments, the substrate 100 can be tilted relative to the ions. This may be done in PLAD or beam line implanters. In other embodiments, higher pressure can be used to modify the incident angle of the particles. Directing the particles at a wide incident angle range may enable greater sputtering rate. At the same time, knock-on implantation, the process by which excess dopants in the film 114 may be driven into the fin 102 by the incident ions, may be limited. Further, changing the incident angle of the particles may enable better control of the sputtering from the top portion and side portions of the fin 102.

Instead of, or in addition to, the sputtering process, the excess dopants may be removed via a chemical etching process. In such an embodiment, inert or reactive gas containing reactive species, such as hydrogen, fluorine, or chlorine ions, may be ionized near the fin 102. The reactive species may then chemically react and selectively etch the excess dopants from the top portion of the fin 102. In one embodiment, the ionized reactive species may be directed toward the substrate 100 at lower energy compared to the sputtering process described above. For example, low bias may be applied to the substrate while the gas containing reactive species is ionized. In other embodiments, no bias voltage is applied to the substrate while the gas containing reactive species is ionized.

Yet in another embodiment, wet etching process may be used to the selectively remove the excess dopants. For example, a piranha strip (sulfuric acid and hydrogen peroxide) or buffered hydrofluoric acid may be used to remove excess dopants.

In another embodiment, the layer at horizontal surface 106 is chemically modified (for example, oxidized) so that it reacts preferentially with the etch chemistry in a wet process (isotropic or otherwise). Buffered HF, DI water, $H_2SO_4$/$H_2O_2$ mixtures are some of the chemistries that can be applied to this process.

If desired, the removal of the excess dopant may be enhanced by incorporating the following optional material modification process to the removal process. In this optional process, the top portion of the thin film 114 may preferentially be exposed to a gas with which the film 114 chemically reacts. For example, an oxygen containing gas or nitrogen containing gas may be used to allow the thin film 114 to experience oxidation or nitridation, respectively. Alternatively, any other material modification gas may be used. The gas may react with the thin film 114 to form a material that can be preferentially etched during the etching or sputtering process. Alternatively, oxygen containing gas, nitrogen containing gas, or other material modification gas may be excited to form a plasma, and the substrate may be exposed to the plasma.

In other embodiments, a passivation step may be performed after the etching process. For example, in the case of $PH_3$ or $AsH_3$ implantation, outgassing of As or P may occur at room temperature. To avoid the emission of these gasses, a passivation step may be required.

After preferentially removing the excess dopants, the dose of the dopants near the top and side portions of the fin 102 may be uniform or substantially uniform, as illustrated in FIG. 1c. The substrate 100 containing non-planar surface may be conformally processed.

The technique noted above is an exemplary one. In another embodiment, the technique may comprise one or more implantation processes and one or more removal processes, and at least one of the implantation process and the removal process may be repeated. In addition, the order of the processes may not be limited to a specific order. For example, the technique may comprise multiple implantation processes and the removal processes, and one of the removal processes may be followed by another one of the removal processes.

In the present disclosure, each of the implantation process and the removal process may have various process parameters. The parameters may be optimized to enhance the technique. The parameters that may be optimized to enhance the technique may include, for example, the pressure at which the technique is performed; the composition of the gases, including the feed gas, diluent gas, and etching gas, introduced near the substrate 100; the type and amplitude of the RF power (e.g. multiple pulsed RF power with one of the pulses having higher amplitude) applied to the plasma source to generate plasma during the implantation process or the removal process; and the characteristics of the bias applied to the substrate (e.g. voltage ramping, duty factor etc.). In some embodiments, it may be desirable to perform the implantation process by generating high pressure plasma. In some embodiments, substrate temperature is controlled between −150 and 600° C.

Specific Exemplary Embodiment

Hereinafter, a specific example of the technique with specific process parameters is disclosed. As noted above, the present disclosure is not limited to one specific set of process parameters. The technique of the present disclosure may have various process parameters. To process the top and side portions of a dynamic random access memory (DRAM) capacitor structure (not shown), the ion implantation process may be performed at high energy, for example, 10 kV or above. In this example, the structure may have one or more openings (e.g. the spacing between the vertically extending protrusions) of 100 nm and the depth of 4 μm (e.g. height of the protrusion). The dopants, meanwhile, may be arsenic. As noted above, the implantation process may be performed by PLAD or PIII system. The implantation process may alternatively be performed by a beam-line ion implantation system. During the implantation process, dopants, in the form of ions, with sufficient energy may impinge at shallow angles on the side walls (e.g. vertically extending surface) of the protrusions. A portion of the impinging ions may bounce from the side wall and implant the entire depth of the trench or the protrusions.

After performing the implantation process, the removal process may be performed. In this example, the removal process may incorporate the optional material modification process. For example, the structure may be exposed to direct oxygen plasma. The oxygen may oxidize the deposited film and reduce volatility of the film and facilitate further removing process.

In the present example, both the implantation process and the removal process may be performed in a single PLAD or PIII system. Alternatively, each of the processes may be performed in a different chambers in a cluster tool. In another example, the technique may be performed in a series of different tools (e.g. cluster or different tools), provided that there is a mechanism to prevent the substrate from reacting with ambient environment.

Systems for Processing a Substrate with Non-Planar Surface

Figure 2:
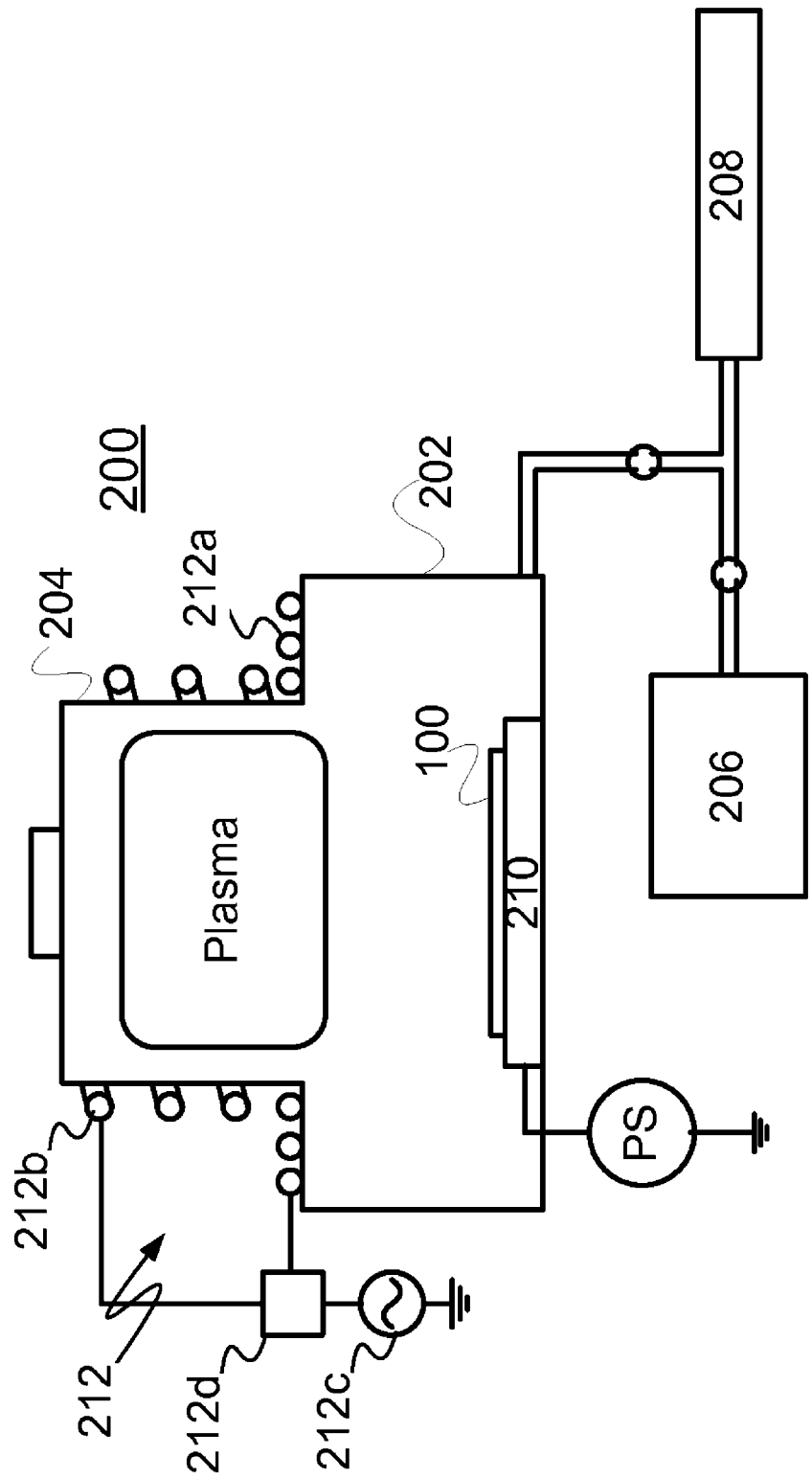
FIG. 2 illustrates a representative PLAD system.

Hereinafter, several examples of the systems to process a substrate with non-planar surface are disclosed. Referring to FIG. 2, there is shown a PLAD system. The system 200 disclosed herein may be a stand alone system. Alternatively, the system 200 may be a part of a cluster tool including one or more systems 200, one or more substrate monitoring systems, one or more other types of substrate processing systems, and one or more transferring systems for transferring the substrate between different systems.

The system 200 may comprise a process chamber 202, which is capable of generating and processing a substrate 100 at high or low pressure plasma. To generate high or low pressure plasma, the system 200 may include at least one of a turbo pump 206 and a mechanical pump 208, and other necessary vacuum sealing components. Inside the process chamber 202, there may be a platen 210 that supports at least one substrate 100. The platen 210 may be equipped with one or more temperature management devices to adjust and maintain the temperature of the substrate 100, such as between 10 and 600° C. Tilting or rotation of the substrate 100 may also be accommodated. A bias source may be electrically coupled to the platen 210, thus the substrate 100, applying a bias voltage to the substrate 100. The bias may be applied by providing continuous or pulsed, RF or DC current. If the bias source provides RF current, an impedance matching network (not shown) may be provided between the bias source and the platen 210. In the present embodiment, the bias source may be capable of adjusting and varying the bias applied to the substrate during operation. For example, the bias from the bias source may ramp up or down, continuously or in steps, the bias applied to the substrate during operation.

The process chamber 202 may also be equipped with one or more in situ monitoring systems. For example, one or more temperature monitoring systems may be included in the processing system 202 to monitor the temperature within the chamber 202 and/or the substrate 100.

The system 200 may also comprise a plasma chamber 204 which may be either coupled or spaced apart, hence remote, from the process chamber 202. The plasma chamber may also include a plasma source 212 for generating high or low density plasma. For example, the plasma chamber 204 may include an inductively coupled plasma (ICP) source, a capacitively coupled plasma (CCP) source, a microwave (MW) source, a glow-discharge (GD) source, or a helicon source, or a combination thereof. If the plasma chamber 204 is equipped with ICP source, the system 200 may comprise at least one of planar and helical coils 212a and 212b, a power source 212c electrically coupled to one or both of the coils 212a and 212b, and an impedance matching network 212d. If the system 200 is equipped with CCP source, the system 200 may comprise at least one electrode (not shown) positioned such that the substrate 202 is interposed between the electrode and the platen 210. A power source 212c may also be included to electrically couple the electrode and the platen 210. Further, the power source 212c may be coupled to an impedance matching network 212d. If the system 200 is equipped with GD source, the system 200 may comprise at least one electrode (not shown) positioned such that the substrate 202 is interposed between the electrode and the platen 210. In addition, a power source may be electrically coupled to the electrode and the platen 210.

Depending on the type of the plasma source 212, the power source may be RF power source or DC power source. For example, if the plasma source 212 is either ICP or CCP source, the power source may be RF power source. However, if the plasma source 212 is GD source, the power source 212 may be DC source. If the plasma source is CCP source, the power source 212c may provide high frequency RF current in the range of 30 to 200 MHz. However, RF current with other frequencies may also be used. If the plasma source 212 is ICP source, RF current provided by the power source 212c may be that in the range of 1 to 30 MHz. However, RF current with other frequencies may also be used. If the plasma source 212 is MW source, the RF current may be in the range of 0.3 to 300 GHz. However, RF current with other frequencies may also be used. The power source 212 may provide continuous or pulsed current.

In one embodiment, the power applied to the plasma source 212 may be constant, for example, a continuous wave. In another embodiment, varying power may be applied to the plasma source 212. For example, two or more pulses may be applied to the plasma source, where the amplitude of one of the pulse is greater than that of another pulse. A detailed description of such an embodiment may be found in U.S. patent application Ser. Nos. 11/771,190, 12/098,781, and 12/105,721, each of which is incorporated herein by reference.

In one embodiment, the power source 212c providing the power to the plasma source (e.g. coil or electrode) may also be the bias source providing bias to the platen 210. For example, the system 200 may comprise a single power source to activate both the platen and at least one of the coils (or the electrode). However, the system 200 may preferably comprise two or more power sources, at least one power source activating the coil or electrode of plasma source and at least one another activating the platen of the processing chamber. Although not shown, the system 200 may contain one or more dopant, etchant, and/or sputtering sources.

As noted above, the system 200 described herein may be a stand alone system 200. Alternatively, the system 200 may be a part of a cluster tool containing one or more processing and/or monitoring systems. If the system 200 is a part of a cluster tool, the cluster tool may include a transfer mechanism to transfer the substrate to and from various processing and/or monitoring systems to sequentially perform various processes without introducing the substrate to open atmosphere.

Figure 3:
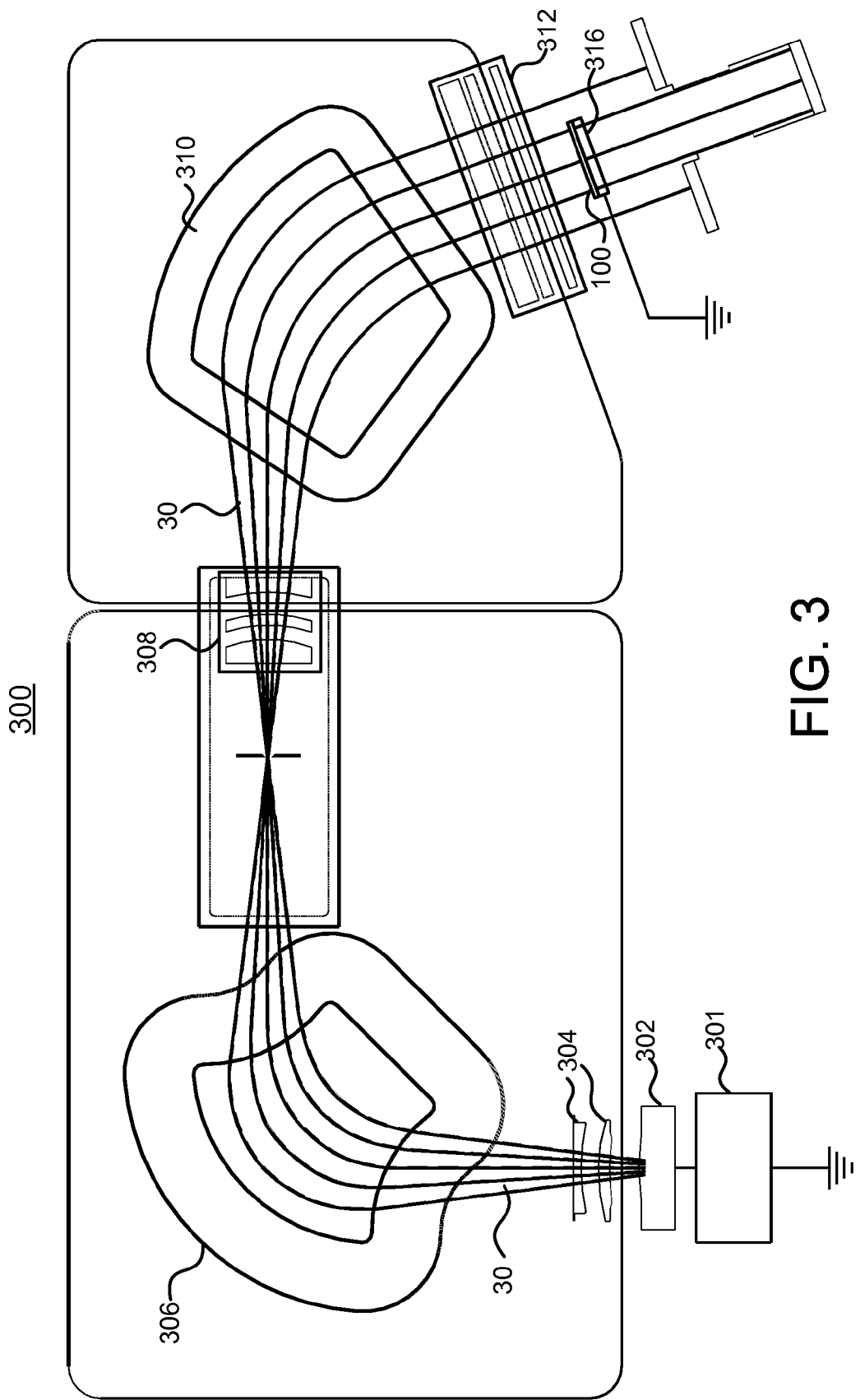
FIG. 3 illustrates a representative beam-line ion implantation system.

Referring to FIG. 3, there is shown a beam-line ion implanter for processing a substrate with a non-planar surface. The ion implanter may include an ion source 302 for generating ions. The ion implanter 300 may also comprise a series of beam-line components. Examples of the beam-line components may include extraction electrodes 304, a magnetic mass analyzer 306, a plurality of lenses 308, and a beam parallelizer 310. The ion implanter 300 may also include a platen 316 for supporting the substrate 100 to be processed. The substrate 100, meanwhile, may be moved in one or more dimensions (e.g., translate, rotate, and tilt) by a component, sometimes referred to as a "roplat" (not shown).

In operation, the ions of the desired species, such as, for example, dopant ions, are generated and extracted from the ion source 302. Thereafter, the extracted ions 30 travel in a beam-like state along the beam-line components and implanted to the substrate 100. Much like a series of optical lenses that manipulate a light beam, the beam-line components manipulate the ion beam 30. The ion beam 30 manipulated by the beam-line components is directed toward the substrate.

In the present disclosure, various types of systems may be used to process the substrate 100. In one embodiment, the same types of system may be used to perform the steps of introducing the dopants 110 and removing the excess dopants 110. For example, the PLAD system 200 may be used to perform both dopant implantation and excess dopant removal techniques. In another example, a beam-line ion implantation system may be used for both techniques. Yet in another embodiment, the PLAD 200 may be used to perform one of the techniques and the beam-line ion implantation system may be used to perform the other technique. If the same type of systems is used to perform both techniques, the present disclosure does not preclude using the same system or different systems to perform both techniques.

In the present disclosure, novel technique for processing a substrate having non-planar surface is disclosed. The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method for processing a substrate, having horizontal and non-horizontal surfaces, comprising:
    ion implanting dopants into said horizontal and non-horizontal surfaces of said substrate, wherein a film is formed on said horizontal surfaces and non-horizontal surface as a result of said ion implanting, and wherein said film formed on said horizontal surfaces contains excess dopants with a dose greater than the dose of the dopants in the film formed on said non-horizontal surfaces; and
    using a selective etching process to remove said film from said horizontal surfaces until dopant doses near said horizontal surfaces and near said non-horizontal surfaces of the substrate are substantially uniform.

2. The method of claim 1, whereby said film is formed on said non-horizontal surfaces and thickness of said film on said horizontal surfaces is greater than that on said non-horizontal surfaces.

3. The method of claim 1, further comprising performing a material modifying step to modify the composition of said film prior to using said etching process.

4. The method of claim 3, wherein said material modifying step comprises oxidation, nitridation or reaction with a gaseous species.

5. The method of claim 1, wherein said etching process comprises sputter etching.

6. The method of claim 5, wherein said sputter etching process uses an inert gas, hydrogen, or a combination thereof.

7. The method of claim 5, wherein said sputter etching process is performed using various angle implants.

8. The method of claim 1, wherein said etching process comprises exposing said film to a plasma comprising hydrogen.

9. The method of claim 1, wherein said implanting and etching steps are performed in a single chamber.

10. The method of claim 1, wherein said implanting and etching steps are performed in different chambers.

11. A method for processing a substrate, having horizontal and non-horizontal surfaces, comprising:
    ion implanting dopants into said horizontal and non-horizontal surfaces of said substrate, wherein a film is formed on said horizontal and non-horizontal surfaces as a result of said ion implanting wherein said film formed on said horizontal surfaces contains excess dopants with a dose greater than the dose of the dopants in the film formed on said non-horizontal surfaces;
    performing a material modifying step to modify the composition of said film; and
    selectively removing said film containing said excess dopants from said horizontal surfaces until said horizontal surfaces and said non-horizontal surfaces of the substrate contain a substantially uniform dopant dose.

12. The method of claim 11, wherein the thickness of said film on said horizontal surfaces is greater than that on said non-horizontal surfaces.

13. The method of claim 11, wherein the removing comprises using an etching process to remove said film from said horizontal surfaces after said material modifying step.

14. The method of claim 13, wherein said etching process comprises exposing said film to a plasma comprising hydrogen.

15. The method of claim 13, wherein said etching process comprises sputter etching.

16. The method of claim 15, wherein said sputter etching process uses an inert gas, hydrogen, or a combination thereof.

17. The method of claim 15, wherein said sputter etching process is performed using various angle implants.

18. The method of claim 11, wherein said material modifying step comprises oxidation, nitridation or reaction with a gaseous species.

19. A method for processing a substrate comprises a fin comprising horizontal and non-horizontal surfaces, the method comprising:

ion implanting dopants into the horizontal and non-horizontal surfaces of the fin of the substrate, wherein a film is formed on said horizontal and non-horizontal surfaces as a result of said ion implanting, wherein said film formed on said horizontal surfaces contains excess dopants with a dose greater than the dose of the dopants in the film formed on said non-horizontal surfaces; and selectively removing a portion of the film on the horizontal surface until a dose of the dopants disposed on the horizontal surface of the fin and the dose of the dopants disposed on the non-horizontal surface of the fin is substantially uniform.

20. The method according to claim 19, further comprising:

modifying the composition of said film prior to using said selective removing.

21. The method according to claim 19, wherein the selective removing is achieved using wet etching process.

* * * * *